United States Patent
Lee et al.

(10) Patent No.: US 11,667,834 B2
(45) Date of Patent: Jun. 6, 2023

(54) METHOD FOR MANUFACTURING LIGHT EMITTING ELEMENT INCLUDING QUANTUM DOT IN AN EMISSION LAYER

(71) Applicant: Samsung Display Co., Ltd., Yongin-si (KR)

(72) Inventors: Changhee Lee, Seoul (KR); Sehun Kim, Yongin-si (KR); Hyojin Ko, Seoul (KR); Dukki Kim, Suwon-si (KR); Jaehoon Kim, Seoul (KR); Hyunmi Doh, Seoul (KR); Yunku Jung, Cheonan-si (KR); Jaekook Ha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 68 days.

(21) Appl. No.: 17/198,752

(22) Filed: Mar. 11, 2021

(65) Prior Publication Data

US 2021/0371732 A1     Dec. 2, 2021

(30) Foreign Application Priority Data

Jun. 2, 2020    (KR) .................. 10-2020-0066729

(51) Int. Cl.
*H10K 50/115*     (2023.01)
*H10K 71/00*     (2023.01)
(Continued)

(52) U.S. Cl.
CPC .......... *C09K 11/025* (2013.01); *H01L 51/502* (2013.01); *H01L 51/56* (2013.01); *B82Y 20/00* (2013.01); *B82Y 40/00* (2013.01)

(58) Field of Classification Search
CPC .................................................. H01L 27/3211
See application file for complete search history.

(56) References Cited

U.S. PATENT DOCUMENTS

| 8,597,730 B2 | 12/2013 | Pickett et al. |
| 9,492,840 B2 | 11/2016 | Lee et al. |

(Continued)

FOREIGN PATENT DOCUMENTS

| CN | 105062462 A | 11/2015 |
| JP | 2005-502176 A | 1/2005 |

(Continued)

OTHER PUBLICATIONS

Linfang, Ligand-regulated ORR activity of Au nanoparticles in alkaline medium: the importance of surface coverage of ligands?, Cite this: Catal. Sci. Technol., Aug. 2018, 746 (Year: 2018).*

*Primary Examiner* — Caleb E Henry
(74) *Attorney, Agent, or Firm* — Lewis Roca Rothgerber Christie LLP

(57) ABSTRACT

A method for manufacturing a light emitting element includes: forming a first electrode; forming a hole transport region on a first electrode; forming an emission layer on the hole transport region; forming an electron transport region on the emission layer; and forming a second electrode on the electron transport region, wherein the forming of the emission layer includes providing a quantum dot composition containing a quantum dot and a ligand bonded to a surface of the quantum dot, to form a preliminary emission layer; and increasing the layer density of the preliminary emission layer by about 5% or greater, thereby improving a luminous efficiency of the light emitting element.

19 Claims, 8 Drawing Sheets

(51) Int. Cl.
*C09K 11/02* (2006.01)
*H01L 51/50* (2006.01)
*H01L 51/56* (2006.01)
*B82Y 40/00* (2011.01)
*B82Y 20/00* (2011.01)

(56) References Cited

U.S. PATENT DOCUMENTS

| | | | |
|---|---|---|---|
| 9,559,322 B2 | 1/2017 | Ko et al. | |
| 9,793,505 B2 | 10/2017 | Zhou et al. | |
| 9,874,693 B2* | 1/2018 | Baiocco | H01L 21/762 |
| 10,287,498 B2 | 5/2019 | Zhou et al. | |
| 2003/0042850 A1 | 3/2003 | Bertram et al. | |
| 2012/0280345 A1* | 11/2012 | Zhu | G02B 6/1226 |
| | | | 257/E31.127 |
| 2014/0027816 A1* | 1/2014 | Cea | H01L 29/1054 |
| | | | 257/E29.085 |
| 2014/0197507 A1* | 7/2014 | Assefa | H01L 31/0745 |
| | | | 438/69 |
| 2015/0091093 A1* | 4/2015 | Bouche | H01L 27/092 |
| | | | 257/369 |
| 2015/0268417 A1* | 9/2015 | Assefa | H01L 27/1461 |
| | | | 385/14 |
| 2016/0204369 A1* | 7/2016 | Ferrini | H01L 51/447 |
| | | | 136/256 |
| 2016/0217723 A1* | 7/2016 | Kim | G09G 3/2003 |
| 2016/0217732 A1* | 7/2016 | Kim | H01L 51/502 |
| 2018/0148638 A1 | 5/2018 | Ahn et al. | |
| 2018/0219185 A1* | 8/2018 | Liu | H01L 51/5056 |
| 2019/0081263 A1* | 3/2019 | Park | H01L 21/02601 |
| 2019/0086733 A1* | 3/2019 | Min | H01L 33/502 |
| 2019/0097101 A1* | 3/2019 | Dorman | C04B 35/584 |
| 2019/0115492 A1* | 4/2019 | Tamma | H01L 33/20 |
| 2019/0115550 A1 | 4/2019 | Kim et al. | |
| 2019/0136126 A1 | 5/2019 | Yang et al. | |
| 2019/0198728 A1* | 6/2019 | Tamma | H01L 33/505 |
| 2019/0276734 A1 | 9/2019 | Kim et al. | |
| 2019/0348577 A1* | 11/2019 | Pathak | H01L 33/0075 |
| 2020/0119297 A1* | 4/2020 | Lee | H01L 51/502 |
| 2020/0168763 A1* | 5/2020 | Min | H01L 51/004 |
| 2020/0403174 A1* | 12/2020 | Kim | H01L 51/5004 |

FOREIGN PATENT DOCUMENTS

| | | |
|---|---|---|
| KR | 10-2014-0121346 A | 10/2014 |
| KR | 10-2015-0063929 A | 6/2015 |
| KR | 10-1700382 B1 | 1/2017 |
| KR | 10-2018-0059363 A | 6/2018 |
| KR | 10-2018-0085232 A | 7/2018 |
| KR | 10-2018-0105873 A | 10/2018 |
| KR | 10-2019-0042192 A | 4/2019 |
| KR | 10-2019-0050726 A | 5/2019 |
| KR | 10-1995371 B1 | 7/2019 |
| KR | 10-2001734 B1 | 7/2019 |
| KR | 10-2019-0106819 A | 9/2019 |
| KR | 10-2020868 B1 | 11/2019 |

* cited by examiner

METHOD FOR MANUFACTURING LIGHT EMITTING ELEMENT INCLUDING QUANTUM DOT IN AN EMISSION LAYER

CROSS-REFERENCE TO RELATED APPLICATION

This application claims priority to and the benefit of Korean Patent Application No. 10-2020-0066729, filed on Jun. 2, 2020, the entire content of which is hereby incorporated by reference.

BACKGROUND

1. Field

One or more aspects of embodiments of the present disclosure relate to a method for manufacturing a light emitting element including a quantum dot, for example, a method for manufacturing a light emitting element including an emission layer formed from a quantum dot composition.

2. Description of the Related Art

Various display devices used in multimedia devices (such as a television set, a mobile phone, a tablet computer, a navigation system, and/or a game console) are being developed. In such display devices, a so-called self-luminescent display element may be used, which accomplishes display by causing an organic light emitting material to emit light.

Light emitting elements using quantum dots as a light emitting material are being developed to enhance the color reproducibility of display devices, and there is a demand for increasing the luminous efficiency and/or service life of a light emitting element using quantum dots.

SUMMARY

One or more aspects of embodiments of the present disclosure are directed toward a method for manufacturing a light emitting element, including a method for forming an emission layer having improved luminous efficiency by removing a ligand bonded to a quantum dot.

One or more example embodiments of the present disclosure provide a method for manufacturing a light emitting element including: forming a first electrode, forming a hole transport region on a first electrode, forming an emission layer on the hole transport region, forming an electron transport region on the emission layer, and forming a second electrode on the electron transport region, wherein the forming of the emission layer includes providing a quantum dot composition, containing a quantum dot and a ligand bonded to a surface of the quantum dot, to form a preliminary emission layer, and increasing the layer density of the formed preliminary emission layer by about 5% or greater.

In the increasing of the layer density of the preliminary emission layer, a part or all of the ligand bonded to the surface of the quantum dot may be removed.

In the increasing of the layer density of the preliminary emission layer, the layer density of the preliminary emission layer may increase by about 10% or greater.

The ligand may be a monodentate ligand or a bidentate ligand.

The method may further include preparing the quantum dot composition by dispersing the quantum dot and the ligand bonded to the surface of the quantum dot in an organic solvent, before the forming the preliminary emission layer.

The quantum dot may be a semiconductor nanocrystal including a core and a shell surrounding the core.

The increasing of the layer density of the preliminary emission layer by about 5% or greater may be performed by providing heat and/or light to the preliminary emission layer.

The ligand may include a head portion bonded to the surface of the quantum dot, and a tail portion containing at least one radical reactive group, wherein the radical reactive group may be a carbonyl group, an ester group, an ether group, a peroxy group, an azo group, a carbamate group, a thiocarbamate group, a carbonate group, or a xanthate group.

The tail portion may be represented by any one among Formulae 1-1 to 1-11:

[Formula 1-1]

[Formula 1-2]

[Formula 1-3]

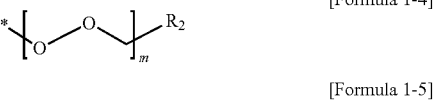
[Formula 1-4]

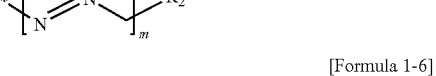
[Formula 1-5]

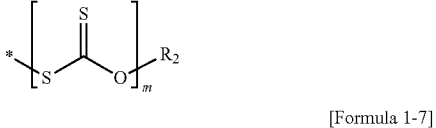
[Formula 1-6]

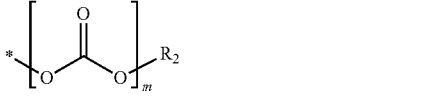
[Formula 1-7]

[Formula 1-8]

[Formula 1-9]

[Formula 1-10]

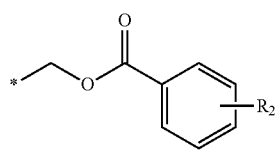

[Formula 1-11]

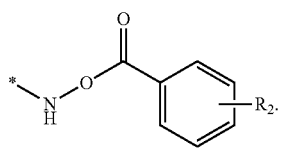

In Formulas 1-1 to 1-11 above, $R_2$ may be an alkyl group having 2 to 20 carbon atoms, and m may be an integer of 1 to 5.

An amount of the quantum dot and the ligand bonded to the surface of the quantum dot may be about 0.5 wt % to about 10 wt % with respect to the total amount of the quantum dot composition.

The quantum dot composition may further include a radical initiator.

An amount of the radical initiator may be about 0.01 wt % to about 1 wt % with respect to the total amount of the quantum dot composition.

The ligand may include a head portion bonded to the surface of the quantum dot, a connecting portion connected to the head portion and containing a metal, and a tail portion coordinated to the metal of the connecting portion.

The metal (of the connecting portion) may include at least one among (selected from) Cd, Zn, In, Sn, Sb, Ga, Ge, As, Hg, Ni, Pd, Pt, Co, Rh, Ir, Fe, Ru, Os, Mn, Mo, and Cr.

The ligand may be represented by Formula 2:

[Formula 2]

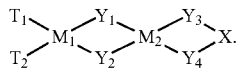

In Formula 2 above, $T_1$ and $T_2$ are each independently a thiol group or a hydroxyl group, $M_1$ and $M_2$ are each independently at least any one selected among Cd, Zn, In, Sn, Sb, Ga, Ge, As, Hg, Ni, Pd, Pt, Co, Rh, Ir, Fe, Ru, Os, Mn, Mo, and Cr, $Y_1$ to $Y_4$ are each independently O or S, and X is a substituted or unsubstituted amine group, a substituted or unsubstituted oxy group, a substituted or unsubstituted thio group, a substituted or unsubstituted ester group, a substituted or unsubstituted amide group, or a substituted or unsubstituted alkyl group having 1 to 20 carbon atoms.

The increasing of the layer density of the preliminary emission layer by about 5% or greater may be performed by providing a polar solvent to the preliminary emission layer.

The ligand may include a head portion bonded to the surface of the quantum dot and containing an ion bond material or a polar solvent dissociative functional group, and a tail portion connected to the head portion.

The head portion may include at least one among a sulfonyl ion, a carbonyl ion, a phosphate ion, an ammonium ion, an oxy group, or an amine group.

The ligand may be represented by any one among Formulae 3-1 to 3-23:

[Formula 3-1]

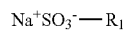

[Formula 3-2]

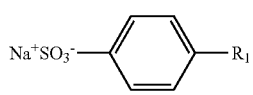

[Formula 3-3]

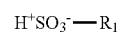

[Formula 3-4]

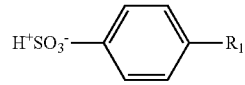

[Formula 3-5]

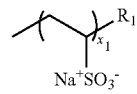

[Formula 3-6]

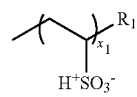

[Formula 3-7]

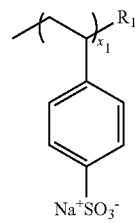

[Formula 3-8]

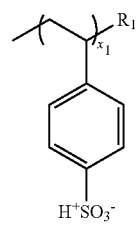

[Formula 3-9]

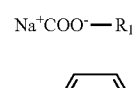

[Formula 3-10]

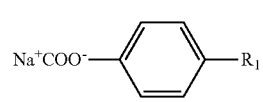

[Formula 3-11]

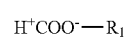

[Formula 3-12]

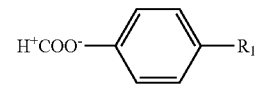

[Formula 3-13]

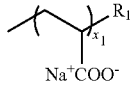

[Formula 3-14]

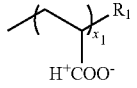

[Formula 3-15]

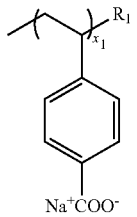

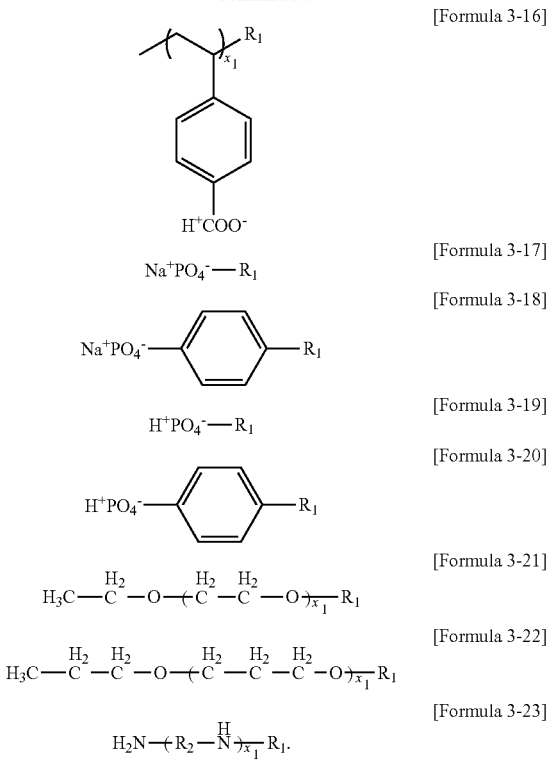

In Formulae 3-1 to 3-23, $R_1$ and $R_3$ may each independently be a substituted or unsubstituted alkyl group having 7 to 30 carbon atoms, or a substituted or unsubstituted aryl group having 6 to 30 ring-forming carbon atoms, and $X_1$ may be an integer of 1 to 10.

In some embodiments, the method may further include cleaning residues (e.g., the cleaning of the residues includes removing one or more ligand residues remaining in the emission layer after their removal from the surface of the quantum dot).

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
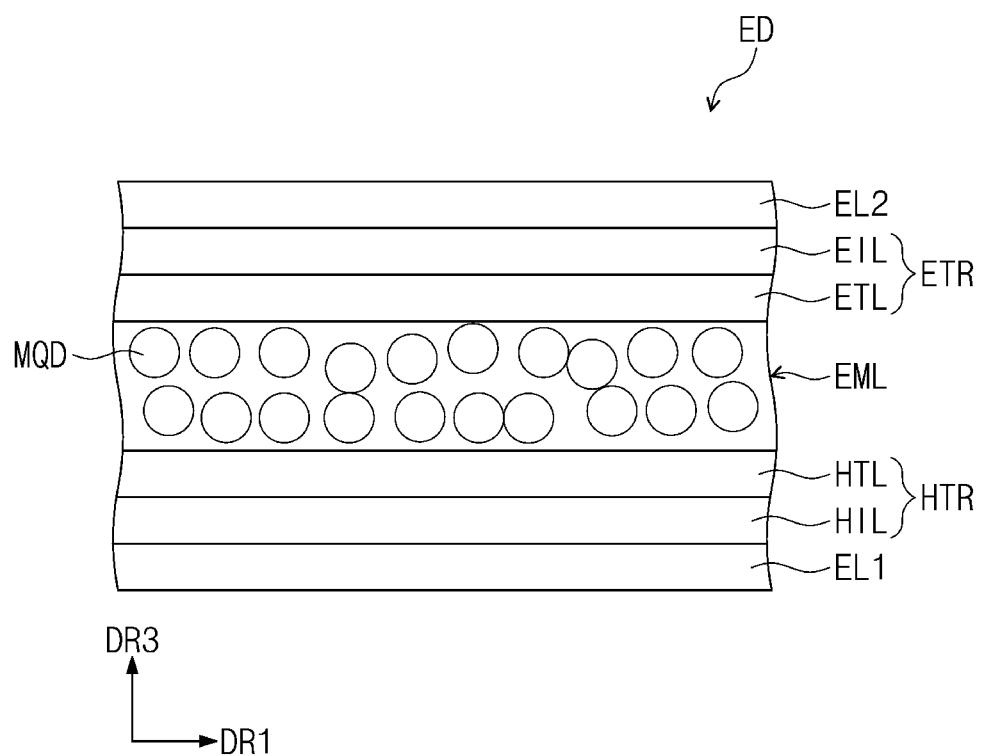
FIG. 1 is a cross-sectional view of a light emitting element of an embodiment.

The present disclosure may be modified in many alternate forms, and selected example embodiments will be illustrated in the drawings and described in detail. It should be understood, however, that the present disclosure is not limited to the particular forms disclosed, but rather, is intended to cover all modifications, equivalents, and alternatives falling within the spirit and scope of the present disclosure.

In the present description, when an element (or a region, a layer, a portion, etc.) is referred to as being "on," "connected to," or "coupled to" another element, it means that the element may be directly disposed on/connected to/coupled to the other element, or that a third element may be disposed therebetween.

In the present disclosure, "directly disposed" indicates that there are no intervening layers, regions, plates, and/or the like between two described elements. For example, "directly disposed" may refer to disposing two layers or two members without additional members (such as an adhesive member) therebetween.

Like reference numerals refer to like elements throughout, and duplicative descriptions thereof may not be provided. In the drawings, the thicknesses, ratios, and dimensions of elements may be exaggerated for an effective description of technical contents.

The term "and/or" includes any and all combinations of one or more of the associated listed items. Further, the use of "may" when describing embodiments of the present disclosure refers to "one or more embodiments of the present disclosure".

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and/or the like are used to describe spatial relationships with respect to the configurations shown in the drawings. The terms are relative concepts, and are used with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, unless expressly defined herein, and should not be interpreted in an ideal or overly formal sense.

It should be understood that the terms "includes," "including," "comprises," and/or "comprising," are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, a quantum dot composition according to an embodiment of the present disclosure, a light emitting element, and a display device including the same will be described with reference to the accompanying drawings.

Figure 2:
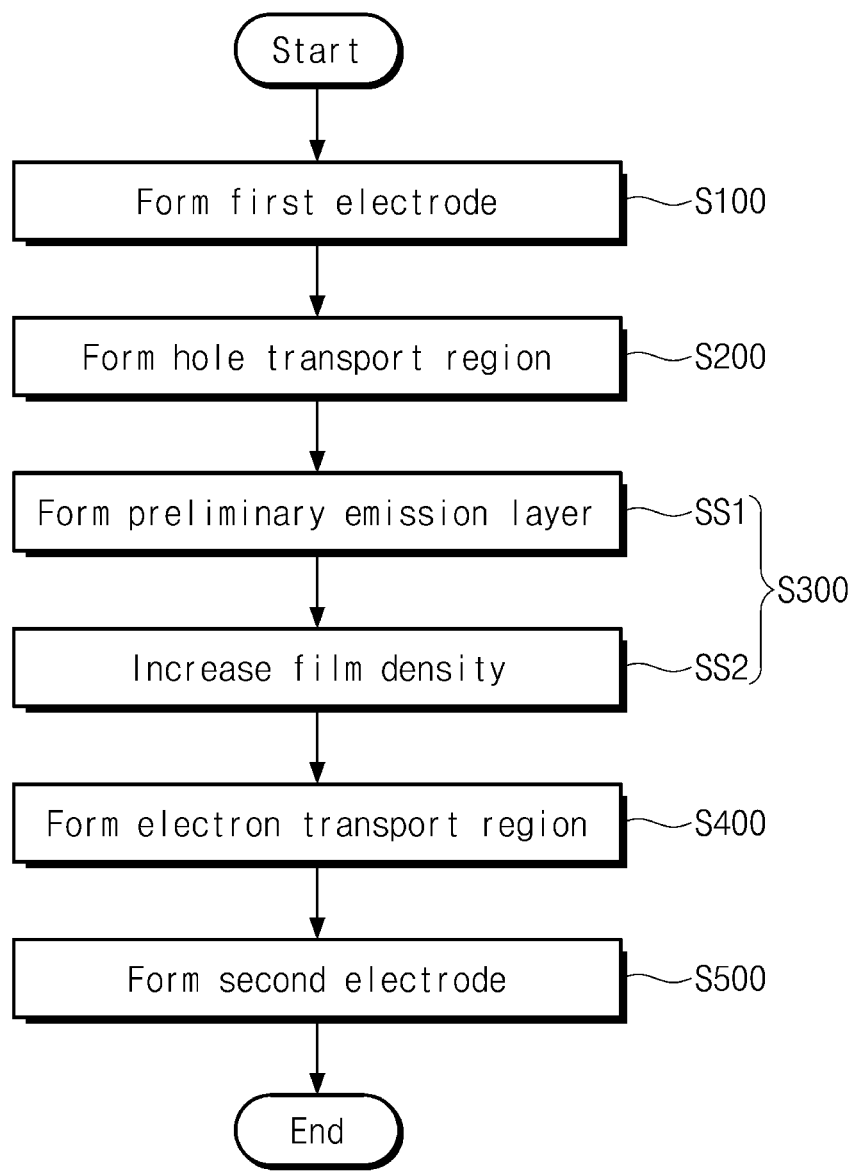
FIG. 2 is a flowchart summarizing a method for manufacturing a light emitting element according to an embodiment.

FIG. 1 is a cross-sectional view of a light emitting element ED of an embodiment. FIG. 2 is a flowchart summarizing a method for manufacturing a light emitting element ED according to an embodiment.

In the present description, the light emitting element ED is manufactured through a method for manufacturing a light emitting element according to an embodiment. The method for manufacturing a light emitting element ED according to an embodiment includes: forming a first electrode EL1, forming a hole transport region HTR on a first electrode EL1, forming an emission layer EML on the hole transport region HTR, forming an electron transport region ETR on the emission layer EML, and forming a second electrode EL2 on the electron transport region ETR.

The forming of the emission layer EML according to an embodiment includes providing a quantum dot composition containing a quantum dot and a ligand bonded to a surface of the quantum dot to form a preliminary emission layer, and increasing the layer density of the preliminary emission layer by about 5% or greater. The emission layer EML formed according to an embodiment may include a surface-modified quantum dot MQD. The surface-modified quantum dot MQD refers to a quantum dot from which a part or all (e.g., at least a portion) of the bonded ligand is removed from the surface of the quantum dot.

In an embodiment, the method may further include forming a capping layer on the second electrode EL2.

The hole transport region HTR and the electron transport region ETR may each include a plurality of sub functional layers. For example, the hole transport region HTR may include a hole injection layer HIL and a hole transport layer HTL as sub functional layers, and the electron transport region ETR may include an electron injection layer EIL and an electron transport layer ETL as sub functional layers. However, embodiments of the present disclosure are not limited thereto, and the hole transport region HTR may further include an electron blocking layer as a sub functional layer, and the electron transport region ETR may further include a hole blocking layer as a sub functional layer.

The method for manufacturing the light emitting element ED according to an embodiment includes forming a first electrode EL1 (S100). The forming of the first electrode EL1 may be performed by depositing a metal alloy and/or a conductive compound on a transparent substrate to form the first electrode EL1 (S100). However, the embodiment of the present disclosure is not limited thereto, and the first electrode EL1 may be formed using any suitable method (such as a vacuum deposition method, a spin coating method, a cast method, a Langmuir-Blodgett (LB) method, an inkjet printing method, a laser printing method, a laser induced thermal imaging (LITI) method, etc.) The first electrode EL1 may have conductivity, and may be an anode electrode and/or a pixel electrode. The first electrode EL1 may be a transmissive electrode or a transflective electrode.

When the first electrode EL1 is a transflective electrode or a reflective electrode, the first electrode EL1 may be formed of silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), a compound thereof, or a mixture thereof (e.g., a mixture of Ag and Mg). In some embodiments, the first electrode EL1 may have a multi-layer structure including a reflective layer or a transflective layer formed of the materials described above, and a transparent conductive layer formed of indium tin oxide (ITO), indium zinc oxide (IZO), zinc oxide (ZnO), indium tin zinc oxide (ITZO), etc. For example, when the first electrode EL1 is formed of a multi-layer metal layer structure, ITO may be deposited on a transparent substrate, Ag may be deposited on the deposited ITO, and then ITO may be deposited on the deposited Ag again to form a stacked layer structure of ITO/Ag/ITO. The type (kind) of the transparent substrate is not particularly limited, and may be, for example, a glass substrate.

The first electrode EL1 may have a thickness of about 1000 Å to about 10000 Å, for example, about 1000 Å to about 3000 Å.

The method for manufacturing the light emitting element ED according to an embodiment includes forming a hole transport region HTR on the first electrode EL1 (S200). The forming of the hole transport region HTR may be performed by depositing a hole transport material and/or a hole injection material on the first electrode EL1. However, embodiments of the present disclosure are not limited thereto, and the hole transport region HTR may be formed using any suitable method (such as a vacuum deposition method, a spin coating method, a cast method, a Langmuir-Blodgett (LB) method, an inkjet printing method, a laser printing method, a laser induced thermal imaging (LITI) method, etc.)

The hole transport region HTR may have a single layer formed of (e.g., consisting of) a single material, a single layer formed of a plurality of different materials, or a multi-layer structure including a plurality of layers formed of a plurality of different materials. For example, the hole transport region HTR may have a single-layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, embodiments are not limited thereto.

The forming of a hole buffer layer may compensate for a resonance distance of the wavelength of light emitted from an emission layer EML, and may thus increase luminous efficiency. The hole buffer layer may be formed of the same materials that may be included in the hole transport region HTR. The electron blocking layer may serve to prevent or reduce electrons from the electron transport region ETR from being injected to the hole transport region HTR.

The hole injection layer HIL may be formed of any suitable material available in the art. The hole injection layer HIL may be formed using, for example, at least one among a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4',4"-tris(N,N-diphenylamino)triphenylamine (TDATA), 4,4',4"-tris{N,-(2-naphthyl)-N-phenylamino)-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrene sulfonate) (PANI/PSS), N,N'-di(naphthalene-1-yl)-N,N'-diphenyl-benzidine (NPD), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may be formed of any suitable material available in the art. The hole transport layer HTL may be formed using, for example, at least one among carbazole-based derivatives (such as N-phenyl carbazole and/or polyvinyl carbazole), fluorene-based derivatives, N,N'-bis(3-methylphenyl)-N,N'-diphenyl-[1,1-biphenyl]-4,4'-diamine (TPD), triphenylamine-based derivatives such as 4,4',4''-tris(N-carbazolyl)triphenylamine (TCTA), N,N'-di(1-naphthalene-1-yl)-N,N'-diphenyl-benzidine (NPD), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may have a thickness of about 5 nm to about 1,500 nm, for example, about 10 nm to about 500 nm. When the hole transport region HTR is formed of a plurality of layers, the hole injection layer HIL may have a thickness of, for example, about 3 nm to about 100 nm, and the hole transport layer HTL may have a thickness of about 3 nm to about 100 nm. In some embodiments, the electron blocking layer EBL may have a thickness of about 1 nm to about 100 nm. When the thicknesses of the hole transport region HTR, the hole injection layer HIL, the hole transport layer HTL, and the electron blocking layer EBL satisfy the above-described range, satisfactory electron injection properties may be obtained without a substantial increase in driving voltage.

The method of manufacturing the light emitting element ED according to an embodiment includes forming an emission layer EML on the hole transport region HTR (S300). For example, the forming of the emission layer EML (S300) includes providing a quantum dot composition containing a quantum dot and a ligand bonded to the surface of the quantum dot on the hole transport region HTR to form a preliminary emission layer (SS1), and increasing the layer density of the formed preliminary emission layer by about 5% or greater (SS2).

Referring to FIG. 1, the emission layer EML formed according to an embodiment includes a plurality of surface-modified quantum dots MQD. The surface-modified quantum dots MQD included in the emission layer EML may be stacked to form a layer (e.g., one or more layers). In FIG. 1, for example, modified quantum dots MQD having a circular cross-section are arranged to form two layers, but embodiments are not limited thereto. For example, the arrangement of the surface-modified quantum dots MQD may vary according to the thickness of the emission layer EML, the shape of the quantum dot QD included in the emission layer EML, and the average diameter of the quantum dots QD. For example, in the emission layer EML, the surface-modified quantum dots MQD may be aligned to be adjacent to each other to form a single layer, or form a plurality of layers (such as two or three layers). The method for forming the emission layer EML will be described in more detail later.

The method for manufacturing the light emitting element ED according to an embodiment includes forming an electron transport region ETR on the emission layer EML (S400). The forming of the electron transport region ETR (S400) may be performed by depositing an electron transport material and/or an electron injection material on the emission layer EML. However, embodiments of the present disclosure are not limited thereto, and the electron transport region ETR may be formed using any suitable method (such as a vacuum deposition method, a spin coating method, a cast method, a Langmuir-Blodgett (LB) method, an inkjet printing method, a laser printing method, a laser induced thermal imaging (LITI) method, etc.)

The electron transport region ETR may have a single layer formed of a single material, a single layer formed of a plurality of different materials, or a multilayer structure including a plurality of layers formed of a plurality of different materials. For example, the electron transport region ETR may have a single layer structure of an electron injection layer EIL or an electron transport layer ETL, and may have a single layer structure formed of an electron injection material and an electron transport material. In some embodiments, the electron transport region ETR may have a single layer structure formed of a plurality of different materials, or may have a structure in which an electron transport layer ETL/electron injection layer EIL, and a hole blocking layer/electron transport layer ETL/electron injection layer EIL are stacked in order from the emission layer EML, but is not limited thereto. The thickness of the electron transport region ETR may be, for example, about 20 nm to about 150 nm.

The electron transport layer ETL may include an anthracene-based compound. However, embodiments of the present disclosure are not limited thereto, and the electron transport layer ETL may be formed of, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate ($Bebq_2$), 9,10-di(naphthalene-2-yl)anthracene (ADN), or a mixture thereof. The thickness of the electron transport layer ETL may be about 10 nm to about 100 nm, and may be, for example, about 15 nm to about 50 nm. When the thickness of the electron transport layer ETL satisfies the above-described range, satisfactory electron transport properties may be obtained without a substantial increase in driving voltage.

The electron injection layer EIL may be formed of a halogenated metal (such as LiF, NaCl, CsF, Yb, RbCl, and/or RbI), a lanthanide metal (such as Yb), a metal oxide (such as $Li_2O$ and/or BaO), or lithium quinolate (LiQ). However, embodiments of the present disclosure are not limited thereto. The electron injection layer EIL may also be formed of a mixture of an electron transport material and an insulating organo-metal salt. The organo-metal salt may include, for example, metal acetates, metal benzoates, metal acetoacetates, metal acetylacetonates, or metal stearates. The thickness of the electron injection layer EIL may be about 0.1 nm to about 10 nm, for example about 0.3 nm to about 9 nm. When the thickness of the electron injection layer EIL satisfies the above-described range, satisfactory electron injection properties may be obtained without a substantial increase in driving voltage.

The electron transport region ETR may include a hole blocking layer as described above. The hole blocking layer may be formed of, for example, at least one of 2,9-dimethyl-4,7-diphenyl-1,10-phenanthroline (BCP) or 4,7-diphenyl-1,10-phenanthroline (Bphen), but is not limited thereto.

The method for manufacturing the light emitting element ED according to an embodiment includes forming a second electrode EL2 on the electron transport region ETR (S500). The forming of the second electrode EL2 (S500) may be performed by depositing a metal alloy and/or a conductive compound on a transparent substrate. However, embodiments of the present disclosure are not limited thereto, and the second electrode EL2 may be formed using any suitable method (such as a vacuum deposition method, a spin coating method, a cast method, a Langmuir-Blodgett (LB) method, an inkjet printing method, a laser printing method, a laser induced thermal imaging (LITI) method, etc.)

The second electrode EL2 formed according to an embodiment may be a common electrode or a cathode. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may be formed of Ag, Mg, Cu, Al, Pt, Pd, Au, Ni, Nd, Ir, Cr, Li, Ca, LiF/Ca, LiF/Al, Mo, Ti, Yb, a compound thereof (e.g., AgYb, AgMg and MgAg compounds according to content, etc.), or a mixture thereof (e.g., a mixture of Ag and Mg, a mixture of Ag and Yb, etc.). For example, the second electrode EL2 may include AgMg, AgYb, or MgAg. In some embodiments, the second electrode EL2 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc.

In some embodiments, the manufacturing method of an embodiment may further include forming an auxiliary electrode to be connected to the second electrode EL2. When the second electrode EL2 is connected with the auxiliary electrode, the resistance of the second electrode EL2 may decrease.

Figure 3:
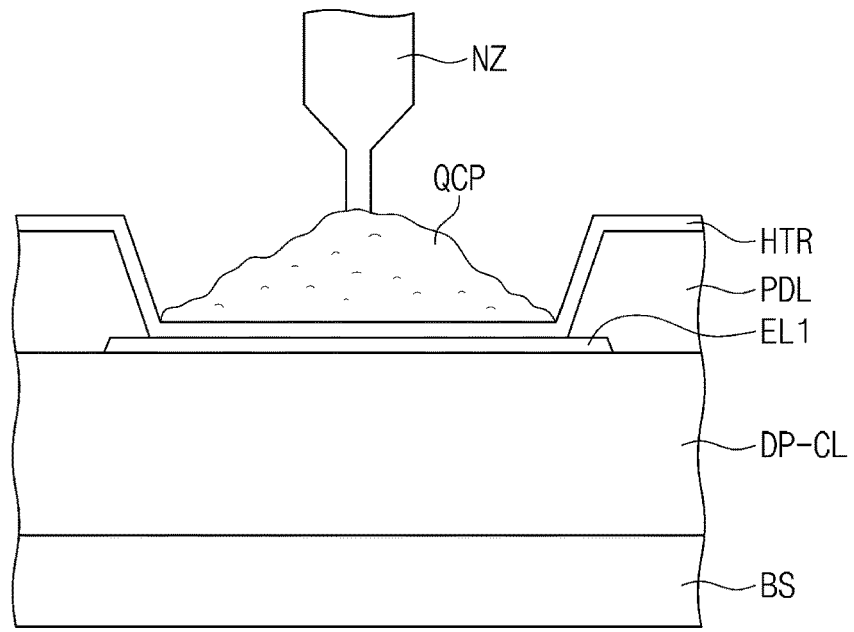
FIG. 3 is a cross-sectional view schematically showing the act of forming a preliminary emission layer according to an embodiment.
Figure 4:
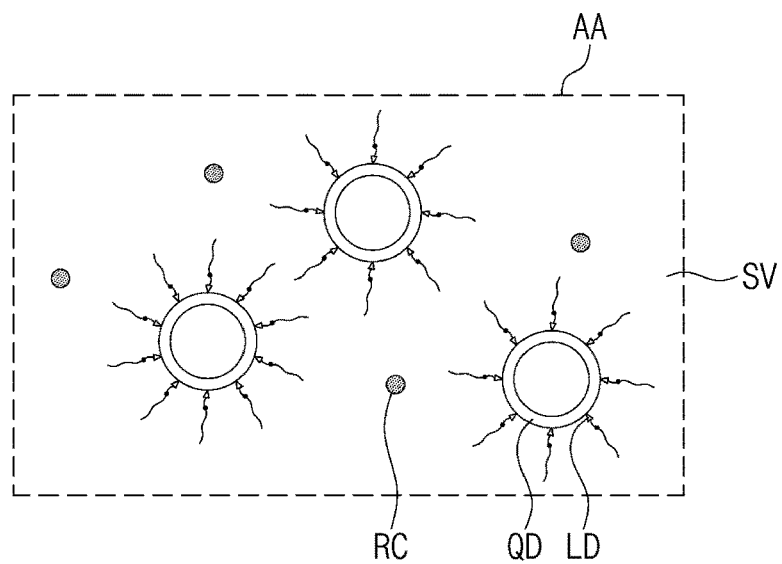
FIG. 4 is a cross-sectional view illustrating a quantum dot composition (structure) according to an embodiment.

FIG. 3 schematically shows the act of forming a preliminary emission layer (SS1) in a method for manufacturing a light emitting element according to an embodiment, and FIG. 4 is a view illustrating a part of a quantum dot composition QCP (a region "AA") provided in FIG. 3 in more detail.

The providing of the preliminary emission layer (SS1) may be performed by applying a quantum dot composition QCP on a hole transport region HTR. FIG. 3 illustrates that the quantum dot composition QCP is applied to a region between a pixel defining film PDL through a nozzle NZ, but embodiments of the present disclosure are not limited thereto, and any suitable method (such as a vacuum deposition method, a spin coating method, a cast method, a Langmuir-Blodgett (LB) method, an inkjet printing method, a laser printing method, and/or a laser induced thermal imaging (LITI) method) may be used.

In FIG. 3, the hole transport region HTR is illustrated to be formed as a common layer so as to overlap the pixel defining film PDL, but embodiments of the present disclosure are not limited thereto, and in some embodiments the hole transport region HTR may be formed between (e.g., only between regions of) the pixel defining film PDL. For example, the hole transport region HTR may be provided between the pixel defining film PDL, using an inkjet printing method.

The thickness of the emission layer EML is not particularly limited, but may be, for example, about 5 nm to about 100 nm, or about 10 nm to about 50 nm.

In an embodiment, the method may further include preparing a quantum dot composition QCP before the forming of a preliminary emission layer (SS1). The preparing of the quantum dot composition QCP may be performed by dispersing a quantum dot QD to which a ligand is bonded in an organic solvent SV. Referring to FIG. 4, a ligand LD is bonded to the surface of the quantum dot QD, and the quantum dot QD may thus have excellent dispersibility in the organic solvent SV. The organic solvent SV is not particularly limited as long as it is capable of dispersing the quantum dot QD to which the ligand is bonded, for example, the organic solvent SV may be hexane, toluene, chloroform, dimethyl sulfoxide, octane, xylene, hexadecane, cyclohexylbenzene, triethylene glycol monobutyl ether, dimethylformamide, decane, dodecane hexadecene, cyclohexybenzene, tetrahydronaphthalene, ethylnaphthalene, ethylbiphenyl, isopropylnaphthalene, isopropylnaphthalene diisopropylnaphthalene, diisopropylbiphenyl, xylene, isopropylbenzene, pentylbenzene, diisopropylbenzene, decahydronaphthalene, phenylnaphthalene, cyclohexyldecahydronaphthalene, decylbenzene, dodecylbenzene, octylbenzene, cyclohexane, cyclopentane, cycloheptane, etc.

The quantum dot composition QCP may further include a ligand removal agent RC. The ligand removal agent RC may facilitate or efficiently induce one or more reactions occurring in (during) the act of increasing the film density (SS2). The type (composition or functionality) of the ligand removal agent RC may vary according to the type of a ligand LD, and may be used alone or in a combination of two or more. For example, the ligand removal agent RC may be at least any one of a radical initiator or a nucleophile. However, the ligand removal agent RC may not be included depending on the type of the ligand LD.

Figure 5A:
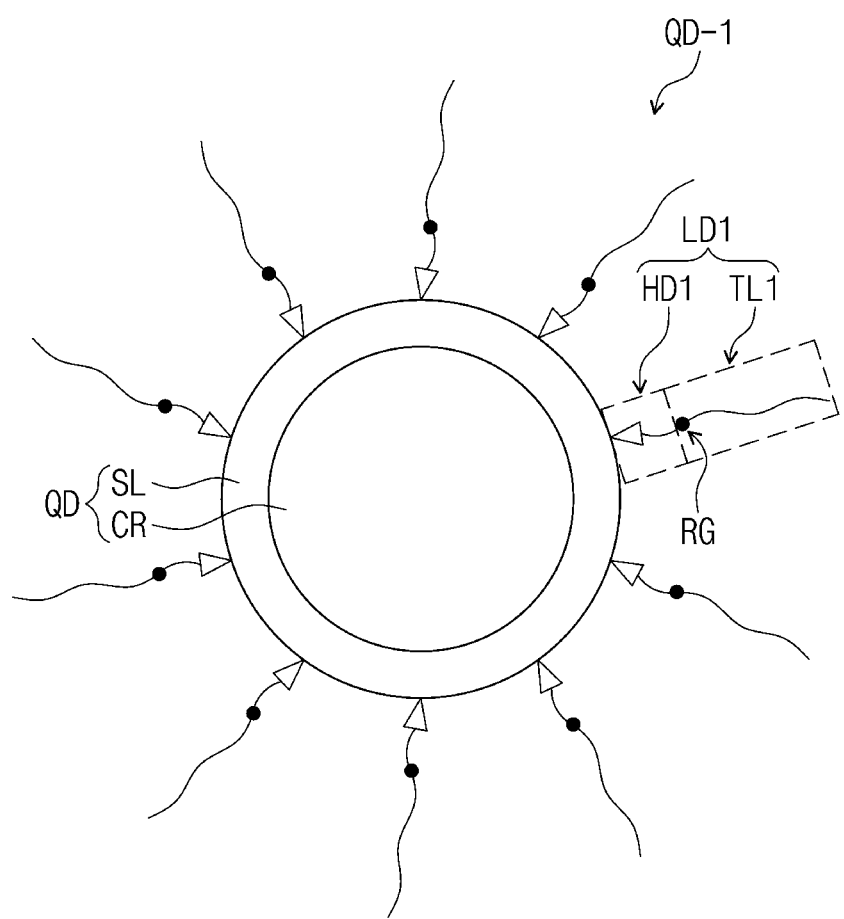
FIGS. 5A to 5C are schematic views of quantum dots to which ligands of an embodiment are bonded.
Figure 5B:
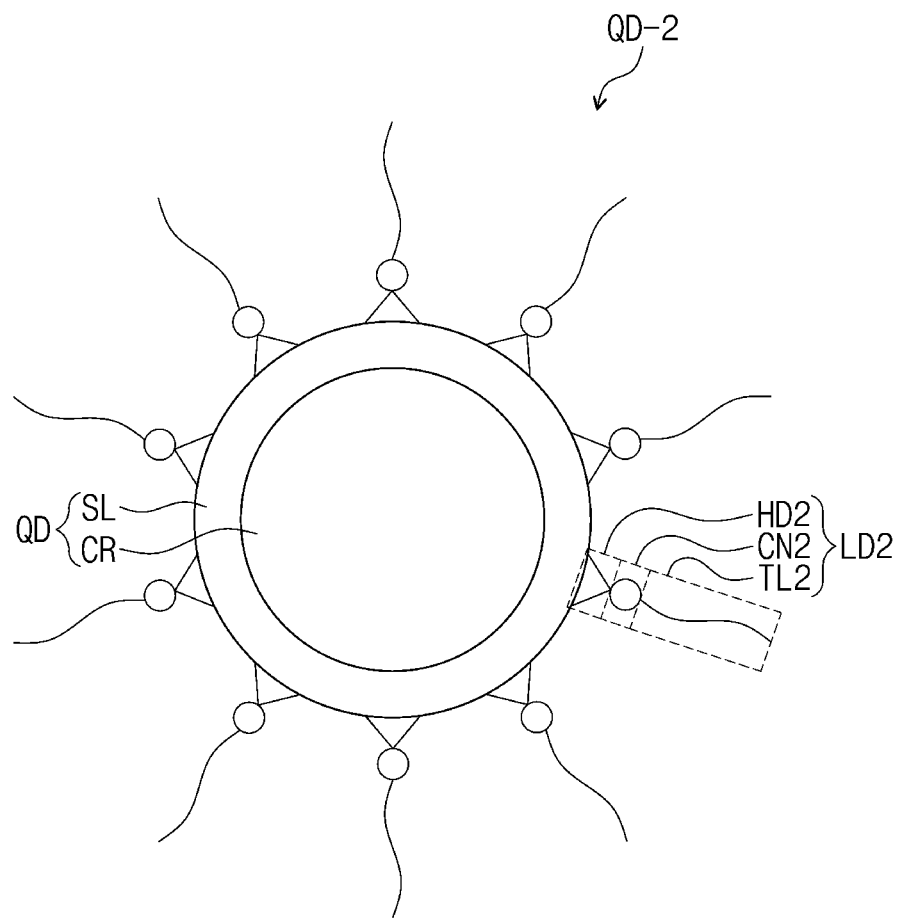
Figure 5C:
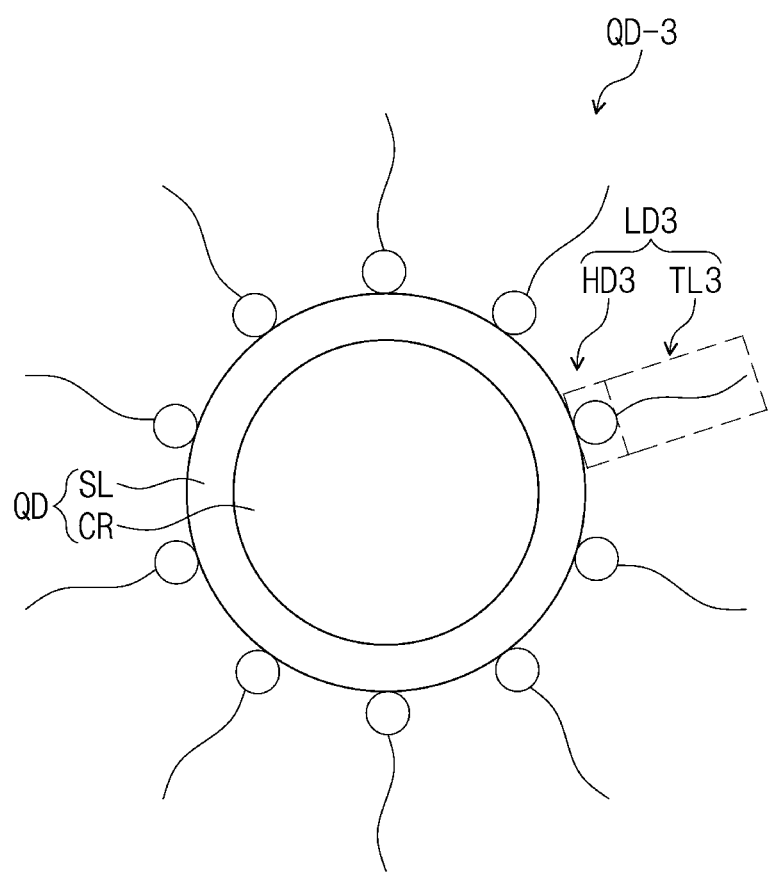

FIGS. 5A to 5C schematically show quantum dots QD-1, QD-2, and QD-3 having ligands LD bonded to surfaces of quantum dots QD according to an embodiment.

The quantum dots QD-1, QD-2, and QD-3 may have ligands LD1, LD2, and LD3 bonded to the respective surfaces thereof to maintain electron injection properties and/or to improve the dispersibility and capping properties of the quantum dots QD. For example, the ligands LD1, LD2, and LD3 may improve the dispersibility of the quantum dots QD (QD-1, QD-2, and QD-3) in an organic solvent SV, and in the act of increasing the layer density (SS2), a part or all of the ligands may be removed to prevent or reduce degradation of electron injection properties.

The quantum dot QD of an embodiment may be a semiconductor nanocrystal selected from a Group II-VI compound, a Group III-V compound, a Group IV-VI compound, a Group IV element, a Group IV compound, and any combination thereof.

The Group II-VI compound may be selected from the group consisting of a binary compound selected from the group consisting of CdSe, CdTe, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound (such as $In_2S_3$ and/or $In_2Se_3$), a ternary compound (such as $InGaS_3$ and/or $InGaSe_3$), or any combination thereof.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, and a mixture thereof, and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V semiconductor compound may further include a Group II metal (e.g., InZnP, etc.).

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

The Group I-III-VI semiconductor compound may include a ternary compound (such as AgInS, $AgInS_2$, CuInS, $CuInS_2$, $CuGaO_2$, $AgGaO_2$, $AgAlO_2$, and/or any combination thereof).

The binary compound, the ternary compound, or the quaternary compound may be present in a particle (quantum dot) in a substantially uniform concentration distribution, or may be present in the same particle in a partially different concentration distribution. In some embodiments, a core/shell structure, in which one quantum dot (shell) surrounds another quantum dot (core), may be present. An interface between the core and the shell may have a concentration gradient in which the concentration of an element present in a shell becomes lower toward the center (e.g., toward the core).

In some embodiments, a quantum dot QD may have a core/shell structure including a core CR having nano-crystals, and a shell SL surrounding the core CR, which are described above. The shell SL of the quantum dot QD having the core/shell structure may serve as a protection layer to prevent or reduce chemical deformation (e.g., degradation) of the core CR so as to maintain its semiconductor properties, and/or as a charging layer to impart electrophoretic properties to the quantum dot QD. The shell SL may be a single layer or multiple layers. An interface between the core CR and the shell SL may have a concentration gradient in which the concentration of an element present in the shell SL becomes lower toward the center (e.g., toward the core). An example of the material utilized to form the shell SL of the quantum dot QD having the core-shell structure may be a metal or non-metal oxide, a semiconductor compound, or a combination thereof.

For example, the metal or non-metal oxide may be a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO), or a ternary compound (such as $MgAl_2O_4$, $CoFe_2O_4$, $NiFe_2O_4$, and/or $CoMn_2O_4$), but embodiments of the present disclosure are not limited thereto.

In some embodiments, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments of the present disclosure are not limited thereto.

A quantum dot QD may have a full width of half maximum (FWHM) of a light emission wavelength spectrum of about 45 nm or less, about 40 nm or less, or about 30 nm or less, and color purity or color reproducibility may be enhanced in the above range. The quantum dot may be to emit light in all directions, and thus a wide viewing angle may be improved.

The form of a quantum dot QD is not particularly limited as long as it is a form commonly used in the related art, and for example, a quantum dot in the form of spherical, pyramidal, multi-arm, or cubic nanoparticles, nanotubes, nanowires, nanofibers, nanoparticles, etc. may be used.

A quantum dot QD may control the color of emitted light according to the particle size thereof (e.g., the color of light emitted by the quantum dot QD may be correlated with the diameter or size of the quantum dot particle), and thus the quantum dot QD may be configured or selected to have various light emission colors such as blue, red, green, etc. The smaller the particle size of the quantum dot QD becomes, the shorter the wavelength of the emitted light, i.e., light in the short wavelength region may be emitted. For example, given two quantum dots QD having the same core (e.g., core composition), the particle size of the quantum dot emitting green light may be smaller than the particle size of a quantum dot emitting red light. In some embodiments, in the quantum dot QD having the same core, the particle size of a quantum dot emitting blue light may be smaller than the particle size of a quantum dot emitting green light. However, embodiments of the present disclosure are not limited thereto, and the particle size of a quantum dot QD may be adjusted according to the forming-materials and shell thickness, independent of the core composition and/or core size.

In some embodiments, when various quantum dots QD have different light emission colors (such as blue, red, green, etc.,) the quantum dots QD may have different core materials.

As described above, the quantum dot QD may include a core CR and a shell SL surrounding the core CR. However, embodiments of the present disclosure are not limited thereto, and the quantum dot QD may have a single-layer structure or may have a plurality of shells.

Referring to FIG. 5A, a ligand LD1 bonded to a quantum dot QD-1 according to an embodiment includes a head portion HD1 bonded to a surface of the quantum dot QD, and a tail portion TL1 exposed to the outside (e.g., toward the surrounding environment), which may be removed in the act of increasing the layer density (SS2).

The head portion HD1 of the ligand LD1 is bonded to the surface of the quantum dot QD, and may not be removed (e.g., may remain bonded to the surface) even after a radical reaction of the ligand (as described in more detail below), and may remain bound to the quantum dot QD. For example, when the quantum dot QD includes a core CR and a shell SL, the head portion HD1 may be bonded to the shell SL.

The head portion HD1 may include a functional group to bind to the surface of the quantum dot QD. The functional group to bind to the surface of the quantum dot QD may be a hydrophilic group, and may include, for example, a thiol group, a hydroxyl group, a phosphine group, a fluorenyl group, an amine group, or a carboxylic acid group. However, embodiments of the present disclosure are not limited thereto. For example, when the head portion HD1 includes a thiol group, and the shell SL includes a metal ion Zn, the thiol group of the head portion HD1 may bond to Zn so that the ligand LD1 is bonded to the quantum dot QD.

When the head portion HD1 includes a single functional group to bind to the surface of the quantum dot QD, the ligand LD1 may be a monodentate ligand. When the head portion HD1 includes two functional groups to bind to the surface of the quantum dot QD, the ligand LD1 may be a bidentate ligand.

In some embodiments, the head portion HD1 may further include an alkyl group having 1 to 6 carbon atoms. The head part HD1 may further include an alkyl group having 1 to 6 carbon atoms or 1 to 4 carbon atoms to impart stability to the quantum dot QD, but may not inhibit electron injection.

The tail portion TL1 of the ligand LD1 is a portion removed in the manufacturing of an emission layer EML, and may include at least one radical reactive group RG. The radical reactive group RG is not particularly limited as long as it is a functional group capable of reacting with a ligand removal agent RC. For example, the radical reactive group RG may be a carbonyl group, an ester group, an ether group, a peroxy group, an azo group, a carbamate group, a thiocarbamate group, a carbonate group, or a xanthate group.

The tail portion TL1 of the ligand LD1 may further include an alkyl group having 2 to 20 carbon atoms. The tail portion TL1 may further include an alkyl group to control the length of the ligand LD1 so as to control or affect the dispersibility of the quantum dots QD in the quantum dot composition QCP. When the number of carbon atoms of the alkyl group of the tail portion TL1 is less than 2, the distance between the quantum dots QD may be too close (small), and when the number of carbon atoms is greater than 20, the distance between the quantum dots QD may be too far (large).

In an embodiment, the tail portion TL1 may be represented by any one among Formulae 1-1 to 1-11:

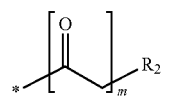
[Formula 1-1]

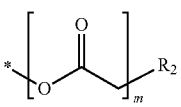
[Formula 1-2]

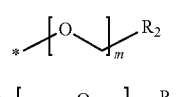
[Formula 1-3]

[Formula 1-4]

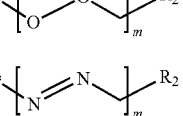
[Formula 1-5]

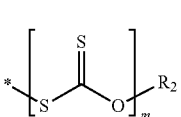
[Formula 1-6]

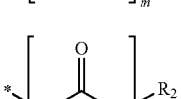
[Formula 1-7]

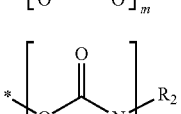
[Formula 1-8]

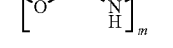

-continued

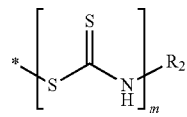
[Formula 1-9]

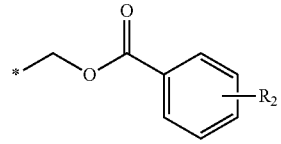
[Formula 1-10]

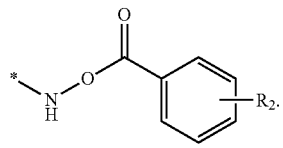
[Formula 1-11]

In Formulas 1-1 to 1-11 above, $R_2$ may be a substituted or unsubstituted alkyl group having 2 to 20 carbon atoms, and m may be an integer of 1 to 5.

In Formulae 1-1 to 1-11, "*—" indicates a position connected to the head portion HD1.

In order to effectively disperse the quantum dot QD in the quantum dot composition QCP, the quantum dot QD to which a ligand LD1 is bonded may be included in an amount of about 0.5 wt % or greater, or about 1 wt % or greater, and about 10 wt % or less, or about 7 wt % or less with respect to the total amount of the quantum dot composition QCP.

In an embodiment, the ligand removal agent RC may be a radical initiator, for example, an azo compound, a photoacid generator, etc. When the ligand removal agent RC is a radical initiator, the radical initiator may be included in an amount of about 0.05 wt % or greater, or about 0.1 wt % or greater, and about 1 wt % or less or about 0.7 wt % or less with respect to the total amount of the quantum dot composition QCP to efficiently perform and accelerate the reaction.

Referring to FIG. 5B, a ligand LD2 bonded to a quantum dot QD-2 according to an embodiment may include a head portion HD2 bonded to a surface of the quantum dot QD, a tail portion TL2 exposed to the outside that may be removed in the act of increasing the layer density (SS2), and a connecting portion CN2 connecting the head portion HD2 and the tail portion TL2. Unless otherwise specified, the description of the head portion HD1 in FIG. 5A may be substantially the same as that applied to the head portion HD2 of the ligand LD2.

The connecting portion CN2 of the ligand LD2 may include a metal. The tail portion TL2 of the ligand LD2 may be coordinated to the metal of the connecting portion CN2. The tail portion TL2 and the head portion HD2 of the ligand LD2 may be coordinated to the metal of the connecting portion CN2.

The connecting portion CN2 of the ligand LD2 may include at least one among cadmium (Cd), zinc (Zn), indium (In), tin (Sn), antimony (Sb, gallium (Ga), germanium (Ge), arsenic (As), mercury (Hg), nickel (Ni), palladium (Pd), platinum (Pt), cobalt (Co), rhodium (Rh), iridium (Ir), iron (Fe), ruthenium (Ru), osmium (Os), manganese (Mn), molybdenum (Mo), and chromium (Cr). The connecting portion CN2 may be reactive with the ligand-removal agent RC included in the quantum dot composition QCP.

In an embodiment, the ligand LD2 may include a structure of an organic ligand, which is an organic material. In an embodiment, the tail portion TL2 of the ligand LD2 may include at least one among (—O(O)—CNR), (—S(S)—CNR), (—O(O)—COR), (—S(S)—COR), (—O(O)—CR), (—S(S)—CR), a pyridine group, a bipyridine group, a quinoline group, a quinolinol group, a chalcogenide connecting atom (S, Se, Te), an oxygen atom, and a nitrogen atom. In the tail portion TL2 of the ligand LD2, R may be an alkyl group having 1 to 20 carbon atoms. In an embodiment, the tail portion TL2 may include, for example, a (—S(S)—C—N—R) structure, and R may be an unsubstituted hexyl group.

In an embodiment, the ligand LD2 may be represented by Formula 2:

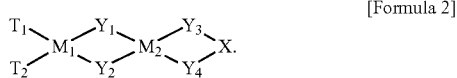

[Formula 2]

In Formula 2, $T_1$ and $T_2$ are each independently a thiol group or a hydroxyl group. $T_1$ and $T_2$ may be the same as or different from each other. In an embodiment, both $T_1$ and $T_2$ may be thiol groups (e.g., simultaneously).

In Formula 2, $M_1$ and $M_2$ are each independently at least any one among Cd, Zn, In, Sn, Sb, Ga, Ge, As, Hg, Ni, Pd, Pt, Co, Rh, Ir, Fe, Ru, Os, Mn, Mo, and Cr. $M_1$ and $M_2$ may be the same as or different from each other. In an embodiment, $M_1$ may be Sn, and $M_2$ may be Zn.

In Formula 2, $Y_1$ to $Y_4$ may each independently be O or S. $Y_1$ to $Y_4$ may be the same as or different from each other. In an embodiment, both $T_1$ and $T_2$ may be S (e.g., simultaneously).

In Formula 2, X may be a substituted or unsubstituted amine group, a substituted or unsubstituted oxy group, a substituted or unsubstituted thio group, a substituted or unsubstituted ester group, a substituted or unsubstituted amide group, or a substituted or unsubstituted alkyl group having 1 to 20 carbon atoms. In an embodiment, X may be a substituted or unsubstituted alkyl amine group. In an embodiment, X may be an unsubstituted hexyl amine group.

In the present description, the term "substituted or unsubstituted" may indicate that a group may be unsubstituted, or substituted with at least one substituent selected from the group consisting of a deuterium atom, a halogen atom, a cyano group, a nitro group, an amine group, a silyl group, oxy group, thio group, sulfinyl group, sulfonyl group, carbonyl group, a boron group, a phosphine oxide group, a phosphine sulfide group, an alkyl group, an alkenyl group, an alkoxy group, a hydrocarbon ring group, an aryl group, and a heterocyclic group. In some embodiments, each of the substituents exemplified above may be further substituted or unsubstituted. For example, a biphenyl group may be interpreted as an aryl group or as a phenyl group substituted with a phenyl group.

Referring to FIG. 5C, a ligand LD3 bonded to a quantum dot QD-3 according to an embodiment includes a head portion HD3 bonded to a surface of the quantum dot QD, and a tail portion TL3 exposed to the outside that may be removed in the act of increasing the layer density (SS2).

In an embodiment, the head portion HD3 may include a polar solvent dissociative functional group (e.g., a functional group configured to dissociate in a polar solvent) to bind to the surface of the quantum dot QD. The head portion HD may include a polar material capable of being dissociated from the surface of the quantum dot QD by (in the presence of) a polar solvent PS (see FIG. 6). The head portion HD3 may include an ion bond material (e.g., an ionic or charged group), or a functional group having strong polarity (such as an oxy group and/or an amine group). In an embodiment, the head portion HD3 of the ligand LD3 may include a sulfonyl anion, a carbonyl anion, a phosphate anion, an ammonium anion, etc. and a counter cation complex corresponding thereto. In an embodiment, the head portion HD3 of the ligand LD3 may include an alkyl oxy group or an alkyl amine group.

The tail portion TL3 is connected to the head portion HD3, and may include a non-polar organic material to secure dispersibility of the quantum dot QD-3 in a non-polar organic solvent SV. In an embodiment, the tail portion TL3 may include a substituted or unsubstituted alkyl group having 7 to 30 carbon atoms, or a substituted or unsubstituted aryl group having 6 to 30 ring-forming carbon atoms. For example, the tail portion TL3 may include a substituted or unsubstituted phenyl group.

In an embodiment, the ligand LD3 may be represented by any one among Formulae 3-1 to 3-23:

[Formula 3-1]

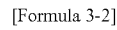

[Formula 3-2]

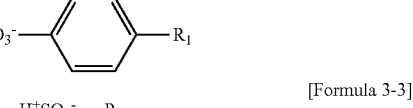

[Formula 3-3]

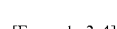

[Formula 3-4]

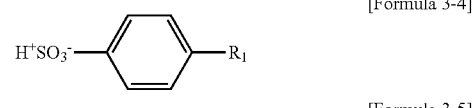

[Formula 3-5]

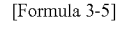

[Formula 3-6]

[Formula 3-7]

[Formula 3-8]

[Formula 3-9]

[Formula 3-10]

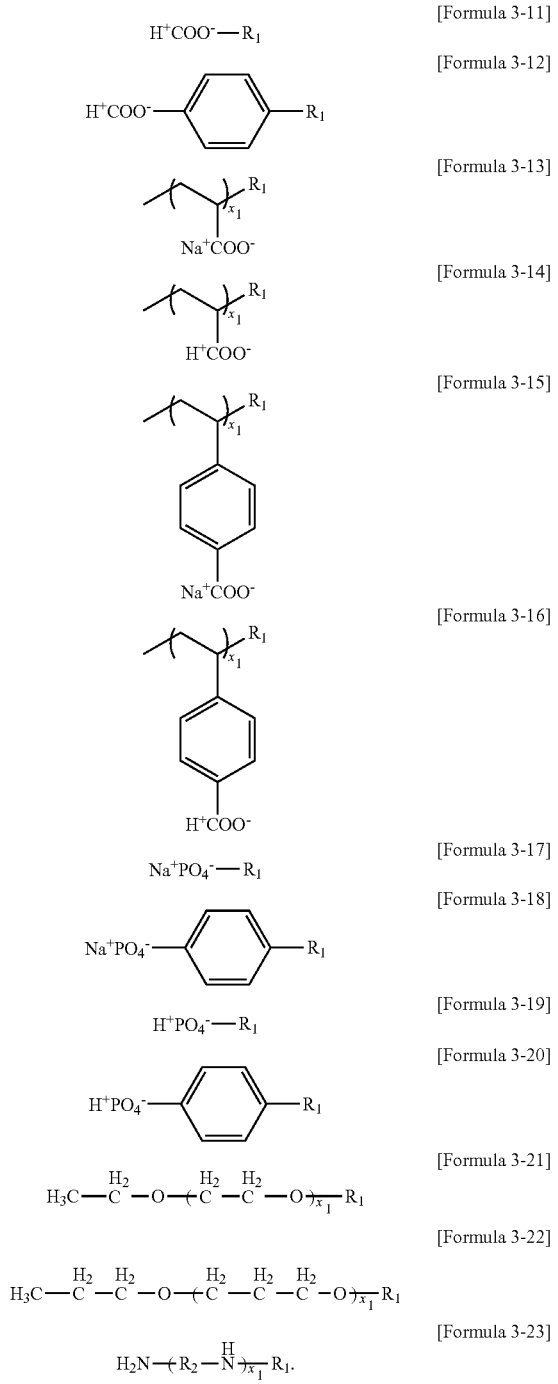

[Formula 3-11]
[Formula 3-12]
[Formula 3-13]
[Formula 3-14]
[Formula 3-15]
[Formula 3-16]
[Formula 3-17]
[Formula 3-18]
[Formula 3-19]
[Formula 3-20]
[Formula 3-21]
[Formula 3-22]
[Formula 3-23]

In Formulae 3-1 to 3-23, $R_1$ and $R_3$ may each independently be a substituted or unsubstituted alkyl group having 7 to 30 carbon atoms, or a substituted or unsubstituted aryl group having 6 to 30 ring-forming carbon atoms. In Formulae 3-1 to 3-23, $X_1$ may be an integer of 1 to 10.

Figure 6:
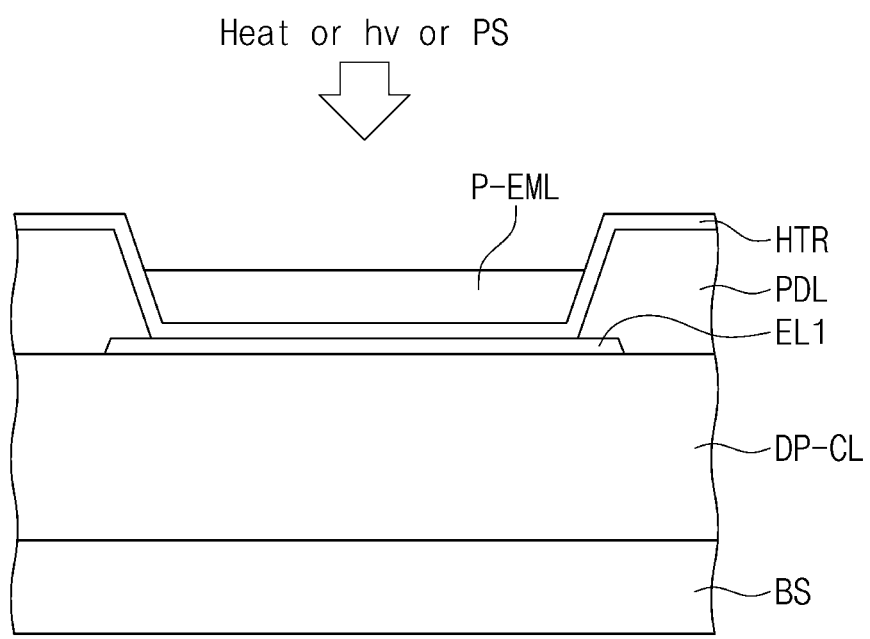
FIG. 6 is a cross-sectional view schematically showing the act of increasing layer density according to an embodiment.
Figure 7A:
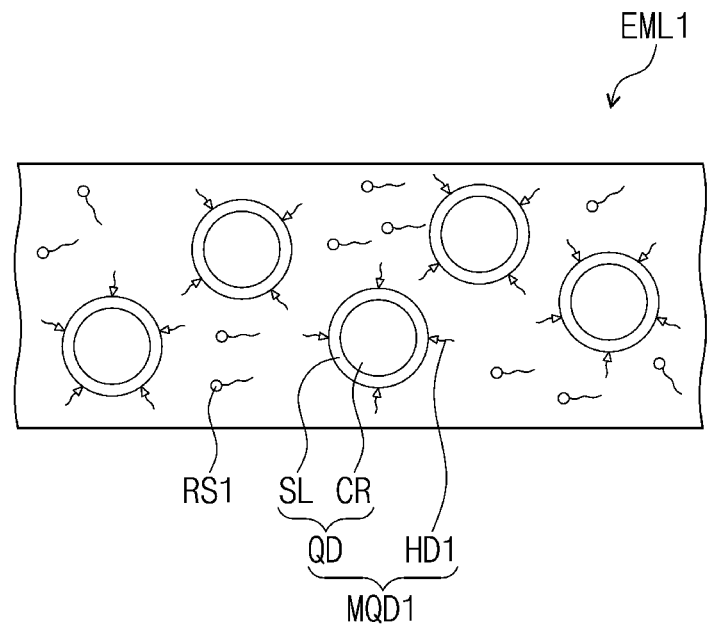
FIGS. 7A and 7B are cross-sectional views showing an emission layer according to an embodiment.
Figure 7B:
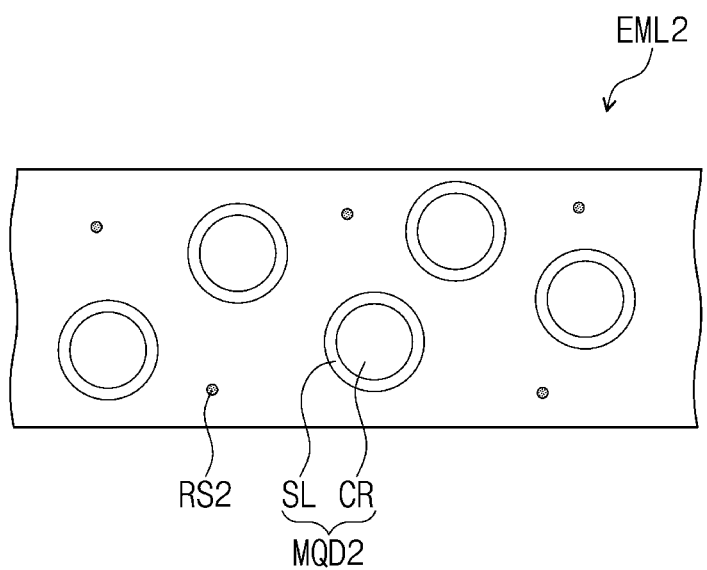

FIG. 6 is a cross-sectional view schematically showing the act of increasing the layer density (SS2) according to an embodiment, and FIGS. 7A and 7B are cross-sectional views showing an emission layer formed according to a manufacturing method of an embodiment.

The increasing of the layer density (SS2) may be performed by removing a ligand LD bonded to a quantum dot QD. The removal of a part or all of the ligand LD (e.g., the entire ligand LD) bonded to the quantum dot QD may result in surface-modified quantum dots MQD1 and MQD2, and the distance from other adjacent surface-modified quantum dots may become closer (e.g., the spacing between adjacent surface-modified quantum dots may be decreased). For example, as the distance between the quantum dots QD becomes closer when the ligand LD is removed, the emission layers EML1 and EML2 may have increased layer densities compared to a preliminary emission layer P-EML. The layer densities of the emission layers EML1 and EML2 may increase by about 5% or greater compared to the preliminary emission layer P-EML. In some embodiments, the layer density may increase by about 7% or greater, or about 10% or greater. For example, the layer density may increase by about 5% to about 50%, about 7% to about 40%, about 10% to about 30%, or about 15% to about 25%.

The increasing of the layer density (SS2) in an embodiment may be performed by removing a part or all of the ligand LD bonded to the quantum dot QD in the preliminary emission layer P-EML. In order to remove a part or all of the ligand LD bonded to the quantum dot QD, according to the type of the ligand, at least one among heat, light (hv), and a polar solvent PS may be applied to the preliminary emission layer P-EML.

In an embodiment, the providing of heat may be performed by applying heat (e.g., a heat source) of about 100° C. to about 180° C. to the preliminary emission layer P-EML for 20 minutes or more to induce a reaction to remove the ligand LD bonded to the quantum dot QD. In an embodiment, the providing of light (hv) may be performed by irradiating the preliminary emission layer P-EML with ultraviolet (UV) light having a wavelength of 400 nm or less at a light amount of about 10 mJ/cm² to about 100 mJ/cm² to induce a reaction to remove a part of the ligand LD. Heat or light (hv) may be suitably applied depending on the type of the ligand LD and/or the type of a ligand removal agent RC.

For example, when the preliminary emission layer P-EML includes the quantum dot QD-1 described in FIG. 5A and a ligand removal agent RC as a radical initiator, either heat or light (e.g., UV light) may be provided so that the tail portion TL1 (FIG. 5A) of the ligand LD1 (FIG. 5A) may be removed. In some embodiments, for example, when the preliminary emission layer P-EML includes the quantum dot QD-2 described in FIG. 5B and a nucleophile as a ligand removal agent RC, heat may be provided so that the chain portion CN2 (FIG. 5B) and the tail portion TL2 (FIG. 5B) of the ligand LD2 (FIG. 5B) may be removed. However, embodiments of the present disclosure are not limited thereto.

A part or all of the ligand LD bonded to the quantum dot QD may be removed while the preliminary emission layer P-EML is cured (e.g., concurrently or at the same time), and thus an emission layer EML1 including a surface-modified quantum dot MQD1 may be formed.

In an embodiment, a polar solvent PS may be provided to the preliminary emission layer P-EML. For example, a polar solvent having a combined Hansen Solubility Parameter (HSP) dP and dH of 10 or greater may be applied to the preliminary emission layer P-EML to remove, or induce a reaction to remove all of the ligand bonded to the quantum dot QD. In an embodiment, the polar solvent PS may be ethanol and/or water.

For example, when the preliminary emission layer P-EML includes the quantum dot QD-3 (FIG. 5C) described in FIG. 5C, when the polar solvent PS is added, all of the ligand LD3 (FIG. 5C) may be removed. In an embodiment, when the polar solvent PS is provided, the act of increasing the layer density (SS2) is not performed alone, but may be performed in the same single process together (e.g., concurrently) with forming another layer through a subsequent process on the emission layer. In an embodiment, the providing of the polar solvent PS may be performed in the same single process together (e.g., concurrently) with forming an electron transport region ETR (FIG. 1) on the emission layer. For example, the providing of the polar solvent PS may be performed by dispersing a metal oxide (such as ZnO) as an electron transport material in a polar solvent such as ethanol, and spin coating the obtained dispersion on the preliminary emission layer P-EML. Thereafter, the method may further include providing heat to remove the organic solvent SV and the polar solvent PS. For example, providing heat at 100° C. or higher may facilitate removing the organic solvent SV and the polar solvent PS included in the preliminary emission layer P-EML, and the preliminary emission layer P-EML may be cured to form an emission layer EML2 including a surface-modified quantum dot MQD2 having the ligand removed.

In the emission layers EML1 and EML2 of an embodiment, the removal of a part or all of the ligands LD1, LD2, and LD3 bonded to the quantum dot QD may decrease the distance between the quantum dots QD. The ligands art that are surface-modified by ligands may have improved dispersibility and capping properties in quantum dot compositions, but may exhibit reduced luminous efficiency when applied to light emitting elements because the ligands may inhibit charge injection. However, in the method for manufacturing a light emitting element according to an embodiment of the present disclosure, the distance between quantum dots may be reduced by removing a part or all of the ligands bonded to the quantum dots during the increasing of layer density of a preliminary emission layer. Accordingly, the light emitting element manufactured according to an embodiment may have an increased quantum dot stacking density, may prevent or reduce degradation of charge injection properties, and may improve luminous efficiency.

Hereinafter, the present disclosure will be described in more detail through the following Examples and Comparative Examples. The Examples below are only provided to help the understanding of the present disclosure, and the scope of the present disclosure is not limited thereto.

1. Preparation of Quantum Dot Composition of Example 1 wt % of each of the quantum dots of Examples 1 to 3 and 3 wt % of an azo compound 2,2'-(diazene-1,2-diyl)bis (2-methylpropanenitrile) were dispersed in octane, thereby preparing Example quantum dot compositions 1 to 3, respectively.

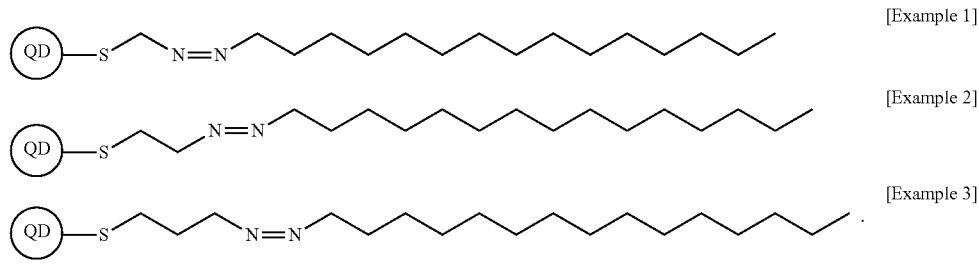

[Example 1]

[Example 2]

[Example 3]

removed from being bonded to the surface quantum dot QD may remain as residues RS1 and RS2 (e.g., may remain in the emission layer without being bonded to the quantum dot). In some embodiments, after the forming of the emission layer (S300) in the method for manufacturing the light emitting element according to an embodiment, an act of cleaning the residues RS may be further included. In the 2. Preparation of Quantum Dot Composition of Comparative Example Comparative Examples 1 and 2 were respectively dispersed in octane in an amount of 1 wt %, preparing Comparative Example quantum dot compositions 1 and 2. The quantum dots QD of Examples and Comparative Examples are the same.

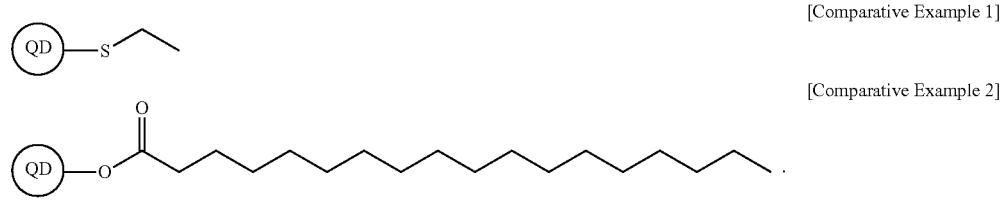

[Comparative Example 1]

[Comparative Example 2]

cleaning of the residues, some residues RS may be removed, and some may remain in the emission layers EML1 and EML2.

The light emitting element manufactured according to an embodiment of the present disclosure may include quantum dots that are substantially evenly distributed, and may include an emission layer having a high layer density due to close distances between the quantum dots, thereby exhibiting excellent luminous efficiency. Quantum dot in the related 2. Evaluation of Light Emitting Element Property 1) Manufacturing of Light Emitting Elements A ITO glass substrate (25×25 mm, 15 Ω/sq) was ultrasonically washed sequentially using distilled water and isopropanol, and UV ozone-cleaned for 30 minutes. PEDOT-PSS (Clevios AI4083) was spin coated on the cleaned substrate, and baked at 110° C. for 30 minutes to form a hole injection layer having a thickness of about 40 nm. An about 1.1 wt % polyvinylcarbazole solution in chlorobenzene was prepared and spin coated on the hole injection layer, and then, baking at 150° C. for 30 minutes in a glove box under a nitrogen atmosphere was performed to form a hole transport layer having a thickness of about 30 nm.

A preliminary emission layer was formed by spin coating the prepared quantum dot composition on the hole transport layer. Thereafter, baking was performed at 110° C. for 30 minutes in a glove box under a nitrogen atmosphere to form an emission layer having a thickness of about 35 nm. Subsequently, a 2.0 wt % dispersion of ZnO nanoparticles in ethanol was prepared and spin coated on the emission layer, and then baking at 110° C. for 30 minutes in a glove box under a nitrogen atmosphere was performed to from an electron transport layer having a thickness of about 60 nm. On the electron transport layer, aluminum (Al) was deposited to a thickness of about 100 nm through thermal evaporation to form a cathode.

2) Evaluation of Light Emitting Element Property

The luminance and efficiency of the light emitting elements according to the Examples and Comparative Examples were measured, and the results are shown in Table 1. Power was supplied from a current-voltmeter (Keithley SMU 236) and the measurement was performed using a luminance meter PR650.

TABLE 1

| | Emission layer | Driving voltage (V) | Efficiency (cd/A) | Change in layer density of emission layer (%) |
|---|---|---|---|---|
| Example 1 | Example quantum dot composition 1 | 3.5 | 7.4 | +15 |
| Example 2 | Example quantum dot composition 2 | 3.4 | 7.5 | +12 |
| Example 3 | Example quantum dot composition 3 | 3.8 | 7.0 | +11 |
| Comparative Example 1 | Comparative Example quantum dot composition 1 | 5.7 | 0.3 | +1.5 |
| Comparative Example 2 | Comparative Example quantum dot composition 2 | 4.8 | 5.4 | +0.9 |

Referring to Table 1, it can be seen that the light emitting elements of Examples 1-3 each have a low driving voltage and excellent luminous efficiency compared to the Comparative Examples. The light emitting element of Comparative Example 1 has an emission layer manufactured from a quantum dot composition having low dispersibility, thereby failing to have quantum dots that are evenly distributed in the emission layer and having fairly low luminous efficiency.

In the light emitting element of Comparative Example 2, an emission layer was formed of a quantum dot to which a ligand having good dispersibility was bonded, thereby exhibiting superior luminous efficiency to Comparative Example 1. However, the fact that the change in layer density in the emission layer is not significant indicates that the emission layer retains a long organic ligand that inhibits electron injection. Accordingly, for Comparative Example 2, it can be seen that the long organic ligand inhibiting electron injection remains in the emission layer, and thus the distance between quantum dots is far, and the organic ligand inhibits electron and hole injection at each interface, thereby reducing the efficiency of the light emitting element.

The light emitting elements of Examples 1 to 3 each include quantum dots having ligands according to an embodiment, thereby having excellent dispersibility, and the effective removal of the tail portion of the ligand bonded to the surface of the quantum dot in the manufacturing of the emission layer reduces the distance between the quantum dots, thereby increasing the layer density of the emission layer than the preliminary emission layer by at least 11% or greater so as to achieve a low driving voltage and improved luminous efficiency.

A method for manufacturing a light emitting element of an embodiment may provide a light emitting element having improved luminous efficiency and/or service life, including an emission layer having excellent dispersion of quantum dots without degradation of electron injection properties.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the present disclosure has been described with reference to example embodiments of the present disclosure, it will be understood that the present disclosure should not be limited to these embodiments, and that various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims and their equivalents.

What is claimed is:

1. A method of manufacturing a light emitting element, the method comprising:
  forming a first electrode;
  forming a hole transport region on the first electrode;
  forming an emission layer on the hole transport region;
  forming an electron transport region on the emission layer; and
  forming a second electrode on the electron transport region,
  wherein the forming of the emission layer comprises:
    providing a quantum dot composition, comprising a quantum dot and a ligand bonded to a surface of the quantum dot, to form a preliminary emission layer; and
    increasing a layer density of the preliminary emission layer by about 5% or greater, and
  wherein the ligand comprises:
    a head portion bonded to the surface of the quantum dot; and a tail portion comprising at least one radical reactive group,
    a head portion bonded to the surface of the quantum dot; a connecting portion connected to the head portion and comprising a metal; and a tail portion coordinated to the metal of the connecting portion, or a head portion bonded to the surface of the quantum dot and comprising an ion bond material or a polar solvent dissociative functional group; and a tail portion connected to the head portion.

2. The method of claim 1, wherein in the increasing of the layer density of the preliminary emission layer, a part or all of the ligand bonded to the surface of the quantum dot is removed.

3. The method of claim 1, wherein in the increasing of the layer density of the preliminary emission layer, the layer density of the preliminary emission layer increases by about 10% or greater.

4. The method of claim 1, wherein the ligand is a monodentate ligand or a bidentate ligand.

5. The method of claim 1, further comprising:
preparing the quantum dot composition by dispersing the quantum dot and the ligand bonded to the surface of the quantum dot in an organic solvent, before the forming of the preliminary emission layer.

6. The method of claim 1, wherein the quantum dot is a semiconductor nanocrystal comprising a core and a shell surrounding the core.

7. The method of claim 1, wherein the increasing the layer density of the preliminary emission layer by about 5% or greater is performed by providing heat or light to the preliminary emission layer.

8. The method of claim 7, wherein the ligand comprises:
the head portion bonded to the surface of the quantum dot; and
the tail portion comprising at least one radical reactive group, and
wherein the radical reactive group is a carbonyl group, an ester group, an ether group, a peroxy group, an azo group, a carbamate group, a thiocarbamate group, a carbonate group, or a xanthate group.

9. The method of claim 8, wherein the tail portion is represented by any one among Formulae 1-1 to 1-11:

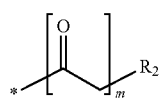 [Formula 1-1]

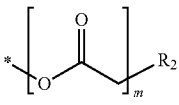 [Formula 1-2]

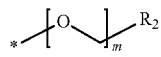 [Formula 1-3]

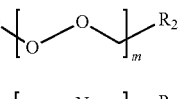 [Formula 1-4]

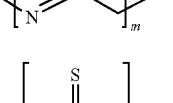 [Formula 1-5]

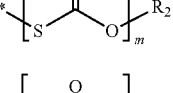 [Formula 1-6]

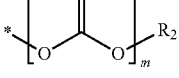 [Formula 1-7]

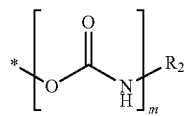 [Formula 1-8]

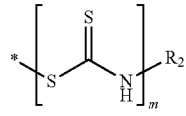 [Formula 1-9]

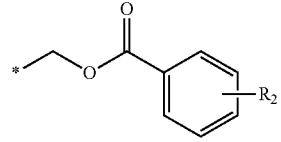 [Formula 1-10]

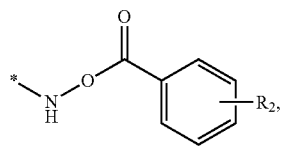 [Formula 1-11]

and
wherein in Formulae 1-1 to 1-11,
$R_2$ is an alkyl group having 2 to 20 carbon atoms, and
m is an integer of 1 to 5.

10. The method of claim 7, wherein the quantum dot and the ligand bonded to the surface of the quantum dot is about 0.5 wt % to about 10 wt % in amount with respect to a total amount of the quantum dot composition.

11. The method of claim 7, wherein the quantum dot composition further comprises a radical initiator.

12. The method of claim 11, wherein the radical initiator is about 0.01 wt % to about 1 wt % in amount with respect to a total amount of the quantum dot composition.

13. The method of claim 7, wherein the ligand comprises:
the head portion bonded to the surface of the quantum dot;
the connecting portion connected to the head portion and comprising a metal; and
the tail portion coordinated to the metal of the connecting portion, and
wherein the metal comprises at least one among Cd, Zn, In, Sn, Sb, Ga, Ge, As, Hg, Ni, Pd, Pt, Co, Rh, Ir, Fe, Ru, Os, Mn, Mo, and Cr.

14. The method of claim 13, wherein the ligand is represented by Formula 2:

[Formula 2]

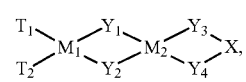 [Formula 2]

and
wherein in Formula 2,
$T_1$ and $T_2$ are each independently a thiol group or a hydroxyl group,
$M_1$ and $M_2$ are each independently at least one selected from Cd, Zn, In, Sn, Sb, Ga, Ge, As, Hg, Ni, Pd, Pt, Co, Rh, Ir, Fe, Ru, Os, Mn, Mo, and Cr,
$Y_1$ to $Y_4$ are each independently O or S, and
X is a substituted or unsubstituted amine group, a substituted or unsubstituted oxy group, a substituted or unsubstituted thio group, a substituted or unsubstituted ester group, a substituted or unsubstituted amide group, or a substituted or unsubstituted alkyl group having 1 to 20 carbon atoms.

15. The method of claim 1, wherein the increasing the layer density of the preliminary emission layer by about 5% or greater is performed by providing a polar solvent to the preliminary emission layer.

16. The method of claim 15, wherein the ligand comprises:
the head portion bonded to the surface of the quantum dot and containing the ion bond material or the polar solvent dissociative functional group; and
the tail portion connected to the head portion.

17. The method of claim 16, wherein the head portion comprises at least one of a sulfonyl ion, a carbonyl ion, a phosphate ion, an ammonium ion, an oxy group, or an amine group.

18. The method of claim 17, wherein the ligand is represented by any one of Formulae 3-1 to 3-23:

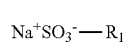

[Formula 3-1]

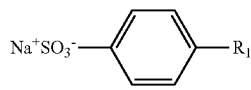

[Formula 3-2]

Na⁺SO₃⁻—R₁

H⁺SO₃⁻—R₁

[Formula 3-3]

[Formula 3-4]

H⁺SO₃⁻—⟨phenyl⟩—R₁

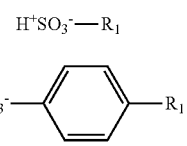

[Formula 3-5]

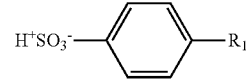

[Formula 3-6]

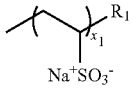

[Formula 3-7]

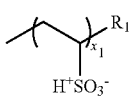

[Formula 3-8]

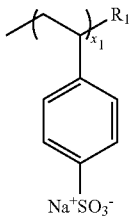

Na⁺COO⁻—R₁

[Formula 3-9]

[Formula 3-10]

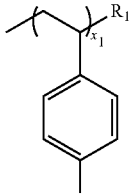

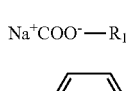

Na⁺COO⁻—⟨phenyl⟩—R₁

H⁺COO⁻—R₁

[Formula 3-11]

[Formula 3-12]

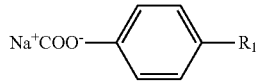

H⁺COO⁻—⟨phenyl⟩—R₁

[Formula 3-13]

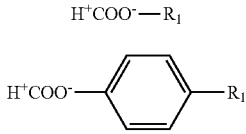

[Formula 3-14]

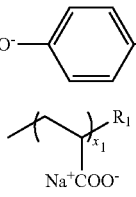

[Formula 3-15]

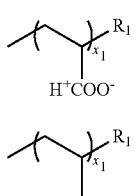

[Formula 3-16]

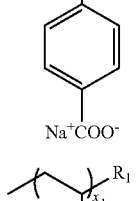

[Formula 3-17]

Na⁺PO₄⁻—R₁

[Formula 3-18]

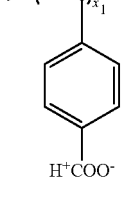

Na⁺PO₄⁻—⟨phenyl⟩—R₁

[Formula 3-19]

H⁺PO₄⁻—R₁

[Formula 3-20]

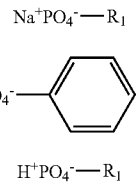

H⁺PO₄⁻—⟨phenyl⟩—R₁

[Formula 3-21]

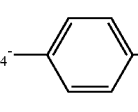

$H_3C-\overset{H_2}{C}-O-(\overset{H_2}{C}-\overset{H_2}{C}-O)_{x_1}R_1$

[Formula 3-22]

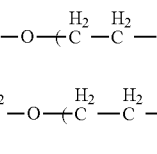

$H_3C-\overset{H_2}{C}-\overset{H_2}{C}-O-(\overset{H_2}{C}-\overset{H_2}{C}-\overset{H_2}{C}-O)_{x_1}R_1$

[Formula 3-23]

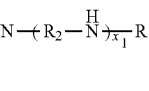

$H_2N-(R_2-\overset{H}{N})_{x_1}R_1,$ and wherein in Formulae 3-1 to 3-23,

R₁ and R₃ are each independently a substituted or unsubstituted alkyl group having 7 to 30 carbon atoms, or a substituted or unsubstituted aryl group having 6 to 30 ring-forming carbon atoms, and $X_1$ is an integer of 1 to 10.

19. The method of claim 1, further comprising: cleaning residues.

* * * * *